United States Patent [19]

Flanders

[11] Patent Number: 4,593,784

[45] Date of Patent: Jun. 10, 1986

[54] LOUDSPEAKER ENCLOSURE

[75] Inventor: Andrew E. Flanders, Cornelius, Oreg.

[73] Assignee: C. Harold Weston, Jr., Portland, Oreg.

[21] Appl. No.: 606,471

[22] Filed: May 3, 1984

[51] Int. Cl.[4] .......... H05K 5/00

[52] U.S. Cl. .......... 181/144; 181/146; 181/147; 181/155

[58] Field of Search .......... 181/144–147, 181/150, 151, 152, 155, 156, 199; 381/88–90; 179/115.5 R

[56] References Cited

U.S. PATENT DOCUMENTS

| | | | |
|---|---|---|---|
| 1,786,279 | 12/1930 | Wolff | 181/155 |
| 2,050,575 | 8/1936 | Krause | 181/155 |
| 2,205,804 | 6/1940 | Wells | 181/155 |
| 2,206,427 | 7/1940 | Preston | 181/152 |
| 2,491,982 | 12/1949 | Kincart | 181/156 |
| 2,815,086 | 12/1957 | Hartsfield | 181/152 X |
| 2,822,884 | 2/1958 | Simpson | 181/156 |
| 2,866,513 | 12/1958 | White | 181/156 |
| 2,871,972 | 2/1959 | Glassey | 181/152 |
| 3,500,953 | 3/1970 | Lahti | 181/151 |
| 3,529,691 | 9/1970 | Wesemann | 181/156 |
| 3,688,864 | 9/1972 | Guss | 381/89 |
| 3,722,616 | 3/1973 | Beavers | 181/156 X |
| 3,892,288 | 7/1975 | Klayman et al. | 181/156 |
| 4,128,738 | 12/1978 | Gallery | 181/156 X |
| 4,133,975 | 1/1979 | Barker | 181/155 X |
| 4,201,274 | 5/1980 | Carlton | 181/156 |
| 4,373,606 | 2/1983 | Clements et al. | 181/155 X |

FOREIGN PATENT DOCUMENTS

| | | | |
|---|---|---|---|
| 908709 | 4/1946 | France | 181/156 |
| 696671 | 9/1953 | United Kingdom | 181/156 |

*Primary Examiner*—Benjamin R. Fuller
*Attorney, Agent, or Firm*—Olson and Olson

[57] ABSTRACT

A loudspeaker enclosure is arranged to support an electromagnetic loudspeaker of the type having both front and back acoustic waves, with the front of the speaker registering with a front wave opening in the enclosure and the back of the speaker communicating through a transmission line cavity with a port the plane of which is disposed substantially normal to the plane of the front wave opening and which port is provided with a cross sectional area of about 0.5 to about 2.0 times the operative area of the driver cone of the loudspeaker, thereby giving a highly efficient means of sound propagation. The enclosure may also house high frequency "tweeter" speakers which provide only a front wave. Acoustic murals and other type reflectors and deflectors may be associated with one or more of the enclosures in an assembly within a room to give the illusion of sound emanating from many more sources than there are loudspeaker enclosures.

7 Claims, 8 Drawing Figures

LOUDSPEAKER ENCLOSURE

BACKGROUND OF THE INVENTION

This invention relates to loudspeakers, and more particularly to a novel loudspeaker enclosure by which to improve significantly the acoustic performance of electromagnetic or electrostatic drivers capable of producing front and back acoustic waves.

Loudspeaker enclosures provided heretofore are characterized generally as having a front opening for directing the front acoustic wave of a loudspeaker forwardly into a room or other space and with the rear side of the enclosure either closed or provided with an opening of random size for directing the back acoustic wave of the loudspeaker into the space in the direction either opposite or parallel to the front wave. Both of these forms of enclosures contribute to the broadcasting of sound which may be characterized as less than desirable in bass reproduction, fidelity and liveliness. These deficiencies are manifest by such characteristics as weak bass, cabinet cavity formants and over-damped sound which is "dry" or lifeless in character. Typical of such prior enclosures are those disclosed in U.S. Pat. Nos. 2,206,427; 2,815,086; 2,822,884; 2,866,513; 2,871,972; 3,500,953; 3,529,691; and 3,892,288.

SUMMARY OF THE INVENTION

In its basic concept, the loudspeaker enclosure of this invention provides a back wave port disposed in a plane substantially normal to the plane of the front wave opening and having an area 0.5 to 2.0 times the operative area of the associated electromagnetic driver, the back side of the associated driver communicating the back wave thereof with the back wave port through a cavity that functions in the manner of an acoustic transmission line.

It is the principal objective of this invention to provide a loudspeaker enclosure of the class described which avoids the aforementioned limitations of prior loudspeaker enclosures.

Another object of this invention is the provision of a loudspeaker enclosure of the class described in which the back wave port has a characteristic acoustic impedance which substantially matches that of the electromagnetic driver, thereby coupling the back wave acoustic energy into a room with improved efficiency.

Still another object of this invention is to provide a loudspeaker enclosure of the class described in which the back wave port is configured to back load the electromagnetic driver in a balanced manner with respect to the front load, whereby to achieve significantly improved fidelity and substantially maximized efficiency.

Another objective of this invention is the provision of a loudspeaker enclosure of the class described in which the back wave port is dimensioned to pass a wide bank of audio frequencies, i.e. several octaves.

A further object of this invention is to provide a loudspeaker enclosure of the class described in which the back wave port terminates an acoustic transmission line substantially in its characteristic impedance, whereby to provide a flat response over the band pass and preclude the usually extensive use of dampening material with which to absorb otherwise standing waves. It is such dampening materials that function to muffle the sound and prevent the broadcasting of sound that is live in character.

A still further object of this invention is the provision of a loudspeaker enclosure of the class described in which the back wave port functions to load the enclosure cavity over a wide band, whereby to avoid resonant peaks or valleys which otherwise "color" the sound.

Another object of this invention is to provide a loudspeaker enclosure of the class described in which the back wave port is configured with a lip by which to introduce turbulent air flow at very low frequencies, whereby to separate further the front and back acoustic waves and correspondingly extend the bass response.

Another objective of this invention is the provision of a loudspeaker enclosure of the class described in which the back wave port is so disposed that when the enclosure is positioned adjacent a wall, floor, or ceiling, the adjacent surface serves as an extension of the enclosure and thereby extends the bass response.

Another object of this invention is to provide a loudspeaker enclosure of the class described capable of projecting sound such that it is heard as being throughout the room and not discerned as coming directly from one or more of the enclosures arranged in the room.

Still another object of this invention is the provision of a loudspeaker enclosure of the class described which may be utilized with frequency selective reflectors to produce increased dimension and motion to the sound with frequency.

A still further object of this invention is to provide a loudspeaker enclosure of the class described which is of simplified construction for economical manufacture.

The foregoing and other objects and advantages of this invention will appear from the following detailed description, taken in connection with the accompanying drawings of preferred embodiments.

DESCRIPTION OF THE PREFERRED EMBODIMENT

Figure 1:
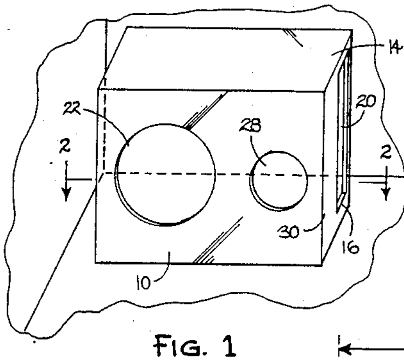
FIG. 1 is a front perspective view of a loudspeaker enclosure embodying the features of this invention, the same being shown supported on a floor or on a shelf of substantial depth adjacent a corner of a room.
Figure 2:
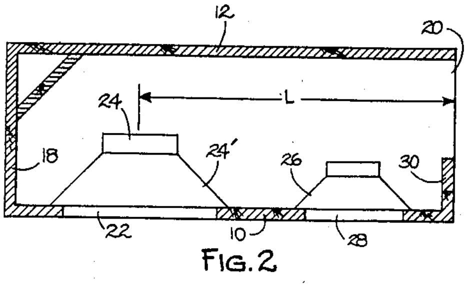
FIG. 2 is a horizontal section taken on the line 2—2 in FIG. 1.

Referring first to the embodiment illustrated in FIGS. 1 and 2 of the drawings, the enclosure is shown to include front wall 10, back wall 12, top wall 14, bottom wall 16, and end wall 18. The opposite end of the enclosure is configured to provide a back wave port 20, described more fully hereinafter.

The front wall 10 is provided with an opening 22 for an electromagnetic or electrostatic driver 24 of the type providing both front and back acoustic waves. Typically, this is provided by an electromagnetic loudspeaker in which the cone 24' is exposed within the cavity of the enclosure. The driver may be of the type that provides bass frequency only, i.e. up to about 200 Hz, or it may be of the type that additionally provides the midrange frequencies of about 200–5000 Hz.

The loudpspeaker enclosure of this invention also may include one or more high frequency speakers, i.e. those providing the sound frequencies above about 3000 Hz. If provided, the high frequency speakers must be of the closed type, i.e. providing no back acoustic wave.

In the embodiment illustrated in FIGS. 1 and 2, one such high frequency "tweeter" 26 is provided, being mounted over a front opening 28 in the front wall 10.

FIGS. 1 and 2 illustrate a "duosonic" enclosure in which the forward projecting acoustic wave of positive phase radiates in the normal manner through the front opening 22 in the front wall of the enclosure. However, the back wave of negative phase radiates into a cavity of specific size and proportions to offer an acoustic impedance substantially matching that of the driver 24. This cavity serves as an acoustic transmission line which is terminated in the port 20. The port is configured to have the same impedance as the driver, thereby "matching" the transmission line and re-radiating the back wave in a direction substantially normal to the front wave.

By avoiding enclosure dimensions whose cross sections in each direction are equal or simple multiples, the cavity is anti-resonant, as long as it is terminated properly.

In describing the propagation of sound as a spherical wave with intensity I, it behaves in accordance with the root-mean-square acoustic pressure p in its medium of travel with a density d and velocity of propagation c, such that $$I=p2/dc$$

wherein the denominator product dc is the characteristic acoustic impedance of the medium, which is a constant for air. This characteristic acoustic impedance is analogous to electrical resistance in the well known equation for electrical power. Accordingly, the impedance Z of an acoustic transmission line is inversely proportional to its area for a given constant of proportionality K, in which $$Z=K/A$$

wherein A is the cross sectional area of the transmission line.

Thus, by making the cross sectional area of the transmission line substantially equal to that of the diaphram 24' of the driver 24, a "match" is achieved wherein acoustic energy is efficiently transferred to the port 20 as a load, and little or no energy is reflected back to cause internal standing waves which adversely color the sound over the response band.

The degree of match that can be achieved as a practical consideration is seldom ideal, since round or oval shaped drivers are usually placed in rectangular boxes or enclosures. As with electrical systems, a square root of two relationship of driver area to that of transmission line and its port provides optimum power or energy transfer. However, the relationship may range between about 0.5 and 2.0 for satisfactory results in many instances.

The frequency response is largely determined by the driver characteristic and the acoustic length L of the transmission line. The high frequency end may be extended beyond the capability of the driver 24 by incorporating a tweeter 26, as shown. The low end of response is basically determined either by the free air resonance of the driver 24 or the acoustic cut-off of the transmission line as related to its length. Transmission lines of sufficient length L may extend the low frequency response below the free air resonance as much as an octave. The cut-off frequency of the transmission line depends upon its acoustic length L with respect to the driver center. This length is one-quarter wave length in air, and the frequency f for that wave length λ in air with a propagation constant c is $$f=c/\lambda$$

As with organ pipes, the length of the acoustic transmission line is effectively extended from its port end by a portion of the equivalent diameter of the opening. Thus, with the driver 24 situated as close as possible to the closed end 18 of the transmission line, the acoustic length approximates that of the enclosure by virtue of this "end effect" when suspended in free air space. In addition, when placed near a wall, floor, or shelf, as illustrated in FIG. 1, the transmission line is further extended effectively as the acoustic waves propagate along these exterior surfaces as though the enclosure were indeed physically longer. The combined extension is a geometrical consideration which is more significant for short or stubby transmission lines than for long ones. Stubby transmission lines have been observed with acoustic lengths about 50 percent greater than the physical length L from the center of the driver 24 to the edge of the port 20.

In the event the "duosonic" enclosure of FIGS. 1 and 2 is used as a woofer speaker with a woofer driver 24, the full range of hearing may be projected from low bass to the upper limit of the tweeter 26. As one enters the contrabass region below about 32 Hz and continues into the infrasonic region just below 16 Hz the air movement of sound behaves somewhat like pneumatic flow. By placing a lip 30 along the edge of the port 20 nearest the front wall 10 mounting the driver 24, additional separation between the front and rear sound waves is achieved by virtue of turbulent flow through the port 20 along the lip edge. This effectively increases the length of the transmission line still further and thereby improves the low end bass response. The lip 30 is formed as a part of the enclosure end wall opposite wall 18.

By placing the enclosure in a corner formed by two adjoining walls, with the port 20 facing in the direction parallel to one wall and the driver opening 22 facing in the direction parallel to the adjoining wall, the front and back acoustic waves do not combine for a considerable distance beyond the loudspeaker enclosure. Accoustically, the enclosure serves as a coupler of acoustic energy to the room in which it is housed, and its acoustic length may functionally be a few to several times its physical length. Factors of two to four times may be realized by proper design and room placement.

Figure 3:
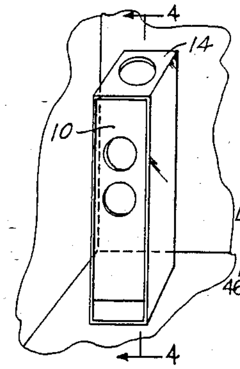
FIG. 3 is a front perspective view, similar to FIG. 1, showing a modified form of loudspeaker enclosure embodying the features of this invention.
Figure 4:
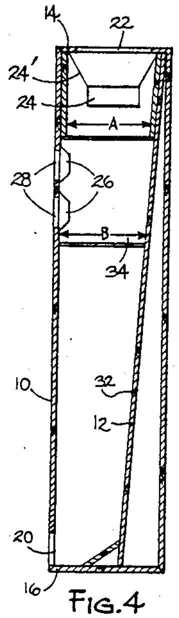
FIG. 4 is a vertical section taken on the line 4—4 in FIG. 3.

A variant of the embodiment of FIGS. 1 and 2 is shown in FIGS. 3 and 4. In this embodiment, a woofer driver 24 is mounted in the top end 14 and the port 20 is located in the front wall 10 adjacent the bottom wall 16. A pair of tweeters 26 are mounted in the front wall 10 registering with the openings 28 a short distance below the driver 24. In a test unit of this embodiment, in which the enclosure measured about 48 inches tall and 10 inches square at its top end, when placed in or near a corner as illustrated in FIG. 3 it exhibited an acoustic length about four times that of its physical length. In this configuration the positive acoustic wave proceeds vertically upward along the adjoining walls and the negative wave proceeds forwardly along the floor.

Referring further to FIG. 4 of the drawing, the internal dimensions of the enclosure preferably are selected so that the cross sectional dimension A is the square root of two times the area of the driver cone 24'; the cross sectional area B adjacent the tweeters 26 just below the support structure for the driver baffle is the square root of two times the cross section A and therefore about twice the area of the drive cone; and, by virtue of the sloping back wall 12, the cross sectional area of the transmission line reduces until at the port 20 it is about 0.7 times the area of the driver cone 24'. It is to be noted that the front wall 10 terminates at the port 20 in a lip, in the manner and for the same purpose as the lip 30 described hereinbefore.

Further, the embodiment illustrated in FIG. 4 is provided with a dampening opening 32 in the back wall 12. This opening is positioned and dimensioned emperically to effect conversion of the fundamental mode to near the second harmonic mode and thus eliminate undesirable resonance by dampening the bass at the fundamental "organ pipe" resonant mode of the transmission line. This is achieved by locating the position for the opening 32 at the approximate mid point of the length of the transmission line, which is the position of maximum acoustic pressure of the fundamental mode, and by progressively increasing the size of the opening until substantially no air passage through the opening can be detected. For example, in the test unit described above, an opening 32 of about one-quarter inch exhibits substantial passage of air. However, when the opening is enlarged to about three-eighths inch, a nul is formed in acoustic pressure and the passage of air suddenly becomes almost undetectable. This reduced the slight coloration resonant rise from about 3 dB to an indiscernible level of about 0.5 dB.

It has been mentioned hereinbefore that the present invention provides a loudspeaker enclosure which is substantially devoid of dampening material which contributes adversely to produce muffled sound. In the embodiment illustrated in FIG. 4, the only damping material employed is a thin layer 34 of polyurethane, glass fiber, or other suitable damping material in sheet form. It is employed in this area merely to absorb certain of the high frequencies produced by the back wave of the woofer which are not desired to emanate from the port.

Figure 5:
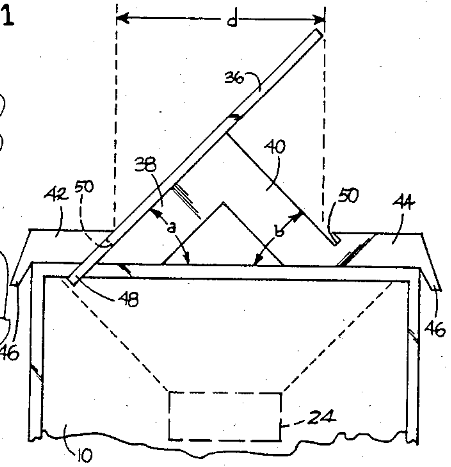
FIG. 5 is a fragmentary side elevation of the upper portion of the enclosure shown in FIG. 4, as viewed from the left in FIG. 4 but on an enlarged scale, showing incorporated therewith a novel reflector embodying features of this invention.

FIG. 5 illustrates an acoustic mural mounted atop the loudspeaker enclosure of FIGS. 3 and 4. The mural includes a substantially rectangular reflector plate 36 supported in an inclined position by a frame formed of a narrow bar configured with an inverted V central portion which provides a pair of angular reflector supports 38 and 40. Extending in opposite directions from the supports are legs 42 and 44 which rest upon the top wall 14 of the enclosure and terminate in downwardly projecting fingers 46 which engage the side edges of the top wall.

The reflector 36 also is provided with downwardly projecting fingers 48 at its opposite ends which engage the side edges of the top wall 14 opposite the edges engaged by the fingers 46. The reflector is provided with a slot which extends inwardly from the edge adjacent the fingers 48 and is dimensioned to freely receive therein one of the legs 42 and 44. A notch 50 in each leg adjacent the support 38 and 40 removably receive a portion of the inclined reflector adjacent the groove, to secure the reflector to the frame.

In the preferred embodiment illustrated, the edges of the supports 38 and 40 which serve to support the reflector 36, are disposed at different angles relative to the plane of the bottom edges of the legs 42 and 44, to provide for the display of the reflector 36 at selected alternate angles relative to the top of the enclosure. In the embodiment illustrated, the supporting edge of the support 38 forms with the bottom edge of the legs 42 and 44 an included angle a of 45 degrees, while the included angle b formed between the supporting edge of the support 40 and the bottom edge of the leg is 50 degrees, to facilitate the propagation direction of the higher frequencies.

The dimension d of the reflector with respect to the propagating wave of the speaker 24 determines the wave length or corresponding frequency at which reflection occurs. Reflection commences at one-half wave length dimension and continues for higher frequencies for hard surfaces. Since frequency is inversely related to wave length, the reflector cut-off frequency for half-wave length may be expressed as the reciprocal of half-wave length.

An acoustic shadow appears behind the reflector above the cut-off frequency, while the reflector becomes transparent below the cut-off frequency. The reflected highs above the cut-off frequency are directed in any desired direction from the loudspeaker enclosure, depending upon the orientation of the reflector, so as to restore substantially the original direction of propagation or to portray a virtual source displaced as desired from the original.

Figure 6:
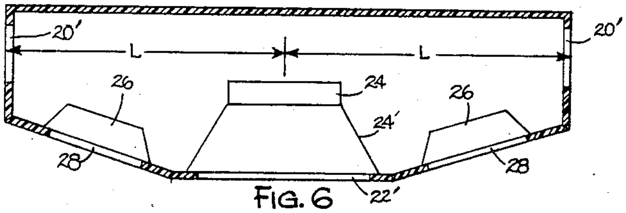
FIG. 6 is a horizontal cross section, similar to FIG. 2, of a modified form of loudspeaker enclosure embodying the features of this invention, providing two back wave ports.

FIG. 6 illustrates a form of "triosonic" loudspeaker enclosure of this invention which provides a pair of back wave ports 20' associated with the single forward opening 22' for the driver 24. This provides a substantially hemispherical propagation of sound. The enclosure is designed to include a pair of tweeters 26 disposed on opposite sides of the driver 24. In this instance the cross sectional area of each port 20' is dimensioned to be approximately one-half the area of the cone 24' of the driver.

Figure 7:
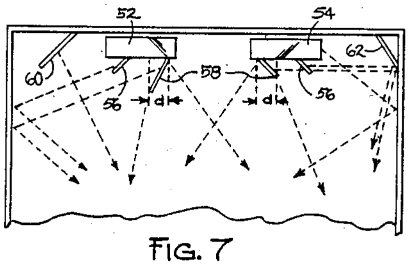
FIG. 7 is a fragmentary plan view illustrating in schematic form an arrangement of louspeaker enclosures and reflectors to provide a room with panoramic sound, i.e. sound which appears to emanate from many locations along a sound stage.

FIG. 7 illustrates in schematic form an arrangement of loudspeakers configured in the manner of FIGS. 1 and 2, together with selective reflectors located in a room in a manner to provide an audio presentation that appears to emanate from many locations along a sound stage. In the illustration, two loudspeaker enclosures 52 and 54, each mounting a tweeter reflector 56 and a woofer or mid-range reflector 58 are positioned along a front wall of a room inwardly of the side walls thereof. Additional reflectors 60 and 62 also may be employed to further enhance the audio presentation.

In manner similar to the arrangement of the reflector 36 in FIG. 5, at least the reflectors 58 are arranged with their minor dimension positioned with respect to the propagating wave at one-half wave length. The reflected highs are directed to the reflecting surfaces provided by the reflectors 60 and 62 as well as the walls of the room to portray a virtual source displaced appropriately from the original sources. The associated time delay and change in phase provides depth and spaciousness to the highs when combined with the others that project outside the shadow zone. As the pitch of tones or their characteristic harmonics sound below and above the cut-off frequency of the reflector, the apparent location of the sound moves gradually with pitch from the speaker enclosures 52 and 54 to mid-way and then on to the reflection surface as a virtual image.

In contrast, when considering a typical stereo sound system employing a pair of unidirectional radiators of sound, a cone of sound emanates over most of the frequency range from each speaker with an included angle of approximately 90 degrees, narrowing somewhat at higher frquencies. For good stereo balance and imaging, the listener should be positioned in the central region where both projecting cones of sound overlap. High frequencies with half-wave lengths approaching the ear separation dimension of the head become perceptible as to direction for appreciable separation angles to each sound source. Harmonics and transient cues in the higher frequencies also give a directional sense for middle and lower pitches of sound. The listener readily identifies the sound as coming from a box. In addition, since the sound sources typically are two in number, low frequency bass waves project in a standing wave arrangement. A thinness to the sound texture is readily observable, compared to the live performance of the apparent multiple sources of FIG. 7.

Figure 8:
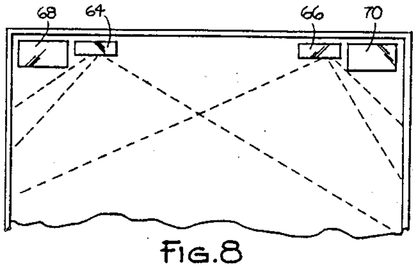
FIG. 8 is a fragmentary plan view, similar to FIG. 7, illustrating in schematic form an arrangement of loudspeaker enclosures of this invention together with special bass speakers to provide more realistic bass tone and give the illusion that the walls of the room are displaced outwardly, creating a more spacious presentation to the sound.

FIG. 8 depicts a pair of "duosonic" satellites 64 and 66 with bass projection companions 68 and 70, preferably "duosonic" woofers. In any case, the front and back bass waves are projected with considerable time delay between them. The delayed acoustic wave is equivalent to a virtual sound source several to a dozen or so feet away, dependent upon the acoustical path length of the enclosure. The illusion is that of the walls of the room being displaced laterally outward, giving a more spacious presentation to the sound than is expected for the visual size of the room.

Of particular importance in this regard is the provision of bass projecting companions 68 and 70 with distinguishable bass characteristics. Boosting the bass usually boosts the lower mid-range considerably, resulting in a muddy sound. However, upon depressing the mid range to restore clarity, bass power and strength is obtained while sacrificing punch and crispness. This "mellow" bass is applied to one of the bass projecting companions, for example bass speaker 68. By dedicating the other bass channel of speaker 70 to a moderate boost in power while retaining the harmonic content, a "crisp" bass is projected simultaneously with the "mellow" bass. These combine acoustically to provide a more realistic presentation.

Further, if the speakers 68 and 70 are "duosonic" woofers of the present invention, the pair of sound waves projected from each emerge displaced in time. The resulting standing waves are displaced spatially in the room. As a result, normal nul zones are filled. This gives added fullness to the sound as characterized by multisound sources.

From the foregoing it will be appreciated that the present invention provides a loudspeaker enclosure which, when combined with a electromagnetic driver producing both front and back acoustic waves, provides spaciousness in sound projection with attendant high efficiency and fidelity. The enclosure is substantially devoid of dampening material, thereby minimizing the cost of manufacture while providing a sound that is live in character. The back wave is utilized to reinforce the front wave, thereby increasing the acoustic efficiency. Moreover, the back wave is directed through an acoustic transmission line and terminated ("matched") in an appropriate port to efficiently radiate the back wave and simultaneously "load" the speaker and the cavity formed by the transmission line. Appropriate loading minimizes enclosure and speaker resonant response, thereby substantialy eliminating adverse coloration by the cavity. With improved efficiency, the driver need not be excited as heavily for the same sound level, resulting in reduced intermodulation distortion and improved fidelity.

Further, the multiple output sound projections give depth to the sound, similar to that achieved with sound chambers or stages by virtue of somewhat discrete sound sources of differing phase. Extended bass frequency response may also be achieved by proper placement of the port next to a plane surface, such as a wall, thereby coupling the back wave along the wall into the room away from the front wave, whereby to minimize acoustic cancellation.

It will be apparent to those skilled in the art that various changes may be made in the size, shape, type, number and arrangement of parts described hereinbefore, without departing from the spirit of this invention and the scope of the appended claims.

I claim:

1. A loudspeaker enclosure comprising:

(a) a hollow box having external front, rear and lateral side walls, and external top and bottom walls, (b) an opening in one of said external walls for association with one side of a loudspeaker which provides both front and back acoustic waves of bass and/or mid-range audio frequencies, and (c) a port in a second of said external walls disposed substantially normal to the opening in said one wall, the port being arranged for association with the side of the loudspeaker opposite said one side and having a cross sectional area of about 0.5 to about 2.0 times the operative area of a loudspeaker to be associated therewith, (d) the interior of the box between the wall opening and the port being proportioned and arranged to function as an acoustic transmission line which is terminated in the port.

2. The loudspeaker enclosure of claim 1 wherein the port has a cross sectional area of about 0.7 to about 1.4 times the operative area of a loudspeaker to be associated therewith.

3. The loudspeaker enclosure of claim 1 including lip means adjacent the port for producing turbulent flow through the port.

4. The loudspeaker enclosure of claim 1 including a second opening in a wall of the enclosure for association with an electromagnetic loudspeaker providing only front acoustic waves of high audio frequencies.

5. The loudspeaker enclosure of claim 1 wherein the external wall opening is substantially midway between the ends of said wall and there is a port adjacent each of said wall ends.

6. The loudspeaker enclosure of claim 1 including a dampening opening in one of the external side enclosure walls positioned substantially midway between the loudspeaker opening and the port and being dimensioned to achieve substantially no passage of air therethrough upon operation of a loudspeaker associated with the fundamental resonance of an air column formed by the enclosure, while contributing negligible loss at other frequencies.

7. The loudspeaker enclosure of claim 1 providing a loudspeaker assembly, comprising:

(a) a pair of satellite loudspeaker enclosures spaced apart laterally and each including an electromagnetic loudspeaker mounted across an associated wall opening, and (b) a pair of woofer loudspeaker enclosures one disposed adjacent each of the pair of satellite loudspeaker enclosures, one of the woofer loudspeakers being arranged to broadcast primarily fundamental bass frequencies and the other woofer loudspeaker being arranged to broadcast primarily harmonics of said fundmental bass frequencies.

* * * * *